US008691622B2

(12) United States Patent
Smythe et al.

(10) Patent No.: US 8,691,622 B2
(45) Date of Patent: Apr. 8, 2014

(54) MEMORY CELLS AND METHODS OF FORMING MEMORY CELLS

(75) Inventors: John Smythe, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/480,610

(22) Filed: May 25, 2012

(65) Prior Publication Data
US 2013/0313678 A1 Nov. 28, 2013

(51) Int. Cl.
*H01L 21/06* (2006.01)
*H01L 21/311* (2006.01)

(52) U.S. Cl.
USPC .... 438/102; 438/103; 438/695; 257/E21.683; 257/E21.691; 257/E45.002

(58) Field of Classification Search
USPC .............. 257/529, E27.103, E27.085, E21.66, 257/E21.678, E21.683, E21.691, E45.002; 438/102, 103, 695–697
See application file for complete search history.

(56) References Cited

U.S. PATENT DOCUMENTS

| | | | | | |
|---|---|---|---|---|---|
| 5,397,742 | A | * | 3/1995 | Kim | 438/630 |
| 5,610,441 | A | * | 3/1997 | Carl et al. | 257/774 |
| 5,892,285 | A | * | 4/1999 | Gonzalez et al. | 257/763 |
| 5,970,374 | A | * | 10/1999 | Teo | 438/629 |
| 5,999,447 | A | | 12/1999 | Naura et al. | |
| 6,096,651 | A | * | 8/2000 | Wang et al. | 438/691 |
| 6,165,864 | A | * | 12/2000 | Shen et al. | 438/396 |
| 6,207,524 | B1 | * | 3/2001 | Gutsche | 438/396 |
| 6,245,671 | B1 | * | 6/2001 | Mathews et al. | 438/640 |
| 6,420,725 | B1 | * | 7/2002 | Harshfield | 257/4 |
| 6,497,802 | B2 | | 12/2002 | Fu | |
| 6,728,137 | B1 | | 4/2004 | Lin | |
| 6,794,698 | B1 | * | 9/2004 | Perng et al. | 257/296 |
| 7,638,789 | B2 | * | 12/2009 | Peters | 257/4 |
| 7,745,287 | B2 | * | 6/2010 | Choi | 438/259 |
| 7,901,980 | B2 | * | 3/2011 | Cheek et al. | 438/102 |
| 7,964,437 | B2 | * | 6/2011 | Lung | 438/95 |
| 8,178,386 | B2 | * | 5/2012 | Lung et al. | 438/102 |
| 2002/0004278 | A1 | * | 1/2002 | Gutsche | 438/396 |
| 2003/0047808 | A1 | * | 3/2003 | Agarwal | 257/751 |
| 2004/0248355 | A1 | | 12/2004 | Polinsky et al. | |
| 2005/0139816 | A1 | * | 6/2005 | Jeong et al. | 257/2 |
| 2005/0142863 | A1 | * | 6/2005 | Spandre | 438/640 |
| 2005/0196923 | A1 | * | 9/2005 | Deppe et al. | 438/259 |
| 2006/0221555 | A1 | | 10/2006 | Pinnow | |
| 2007/0105267 | A1 | * | 5/2007 | Karpov et al. | 438/95 |
| 2009/0321711 | A1 | * | 12/2009 | Takagi et al. | 257/5 |
| 2010/0019240 | A1 | * | 1/2010 | Lee et al. | 257/43 |
| 2010/0090191 | A1 | * | 4/2010 | Lee et al. | 257/3 |

(Continued)

*Primary Examiner* — David S Blum
(74) *Attorney, Agent, or Firm* — Wells St. John, P.S.

(57) ABSTRACT

A method of forming a memory cell includes forming programmable material within an opening in dielectric material over an elevationally inner conductive electrode of the memory cell. Conductive electrode material is formed over the dielectric material and within the opening. The programmable material within the opening has an elevationally outer edge surface angling elevationally and laterally inward relative to a sidewall of the opening. The conductive electrode material is formed to cover over the angling surface of the programmable material within the opening. The conductive electrode material is removed back at least to an elevationally outermost surface of the dielectric material and to leave the conductive electrode material covering over the angling surface of the programmable material within the opening. The conductive electrode material constitutes at least part of an elevationally outer conductive electrode of the memory cell. Memory cells independent of method of manufacture are also disclosed.

29 Claims, 3 Drawing Sheets

(56) References Cited

U.S. PATENT DOCUMENTS

| | | |
|---|---|---|
| 2010/0102308 A1 | 4/2010 | Sun et al. |
| 2010/0193761 A1 | 8/2010 | Amin et al. |
| 2011/0031466 A1 | 2/2011 | Kagawa et al. |
| 2011/0121254 A1 | 5/2011 | Dressler et al. |
| 2011/0136316 A1* | 6/2011 | Chang .................... 438/382 |
| 2011/0140065 A1 | 6/2011 | Maesaka et al. |
| 2011/0147888 A1* | 6/2011 | Steigerwald et al. ......... 257/532 |
| 2011/0155988 A1 | 6/2011 | Ohba et al. |
| 2011/0207323 A1* | 8/2011 | Ditizio .................... 438/675 |
| 2011/0222330 A1 | 9/2011 | Lee et al. |
| 2011/0309322 A1 | 12/2011 | Hwang |
| 2012/0032131 A1 | 2/2012 | Sun et al. |
| 2012/0037873 A1 | 2/2012 | Ikarashi et al. |
| 2012/0040496 A1 | 2/2012 | Sun et al. |
| 2012/0047322 A1 | 2/2012 | Chung |

* cited by examiner

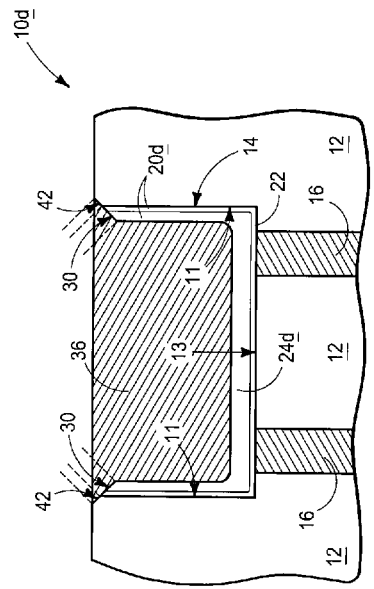
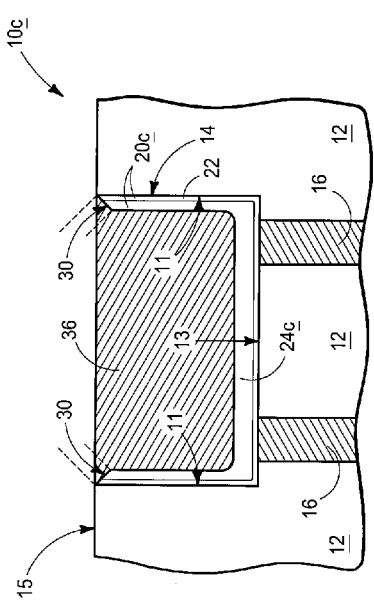
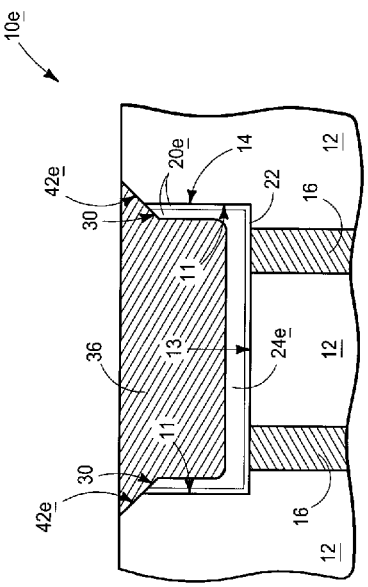

MEMORY CELLS AND METHODS OF FORMING MEMORY CELLS

TECHNICAL FIELD

Embodiments disclosed herein pertain to memory cells and to methods of forming memory cells.

BACKGROUND

Memory is one type of integrated circuitry, and is used in computer and other systems for storing data. Memory is usually fabricated in one or more arrays of individual memory cells. The memory cells may be volatile, semi-volatile, or non-volatile. Non-volatile memory cells can store data for extended periods of time, and in many instances in the absence of power to the circuitry. Volatile memory dissipates and is therefore refreshed/rewritten, often multiple times per second, to maintain data storage. Regardless, the memory cells are configured to retain or store memory in at least two different selectable states. In a binary system, the states are considered as either "0" or a "1". In other systems, at least some memory cells may be configured to store more than two levels or states of information.

Integrated circuitry fabrication continues to strive to produce smaller and denser integrated circuits. The smallest and simplest memory cell will likely be comprised of two electrically conductive electrodes having a programmable material between the electrodes. In some instances, the programmable material may be highly oxidizable if exposed to air or other oxygen-containing material during fabrication of the memory cell. This can lead to fabrication of inoperable or inconsistent memory cells.

BRIEF DESCRIPTION OF THE DRAWINGS

FIG. 9 is a diagrammatic structural cross-section view of a substrate in process in accordance with an embodiment of the invention.

FIG. 10 is a diagrammatic structural cross-section view of a substrate in process in accordance with an embodiment of the invention.

FIG. 11 is a diagrammatic structural cross-section view of a substrate in process in accordance with an embodiment of the invention

DETAILED DESCRIPTION OF EXAMPLE EMBODIMENTS

Figure 1:
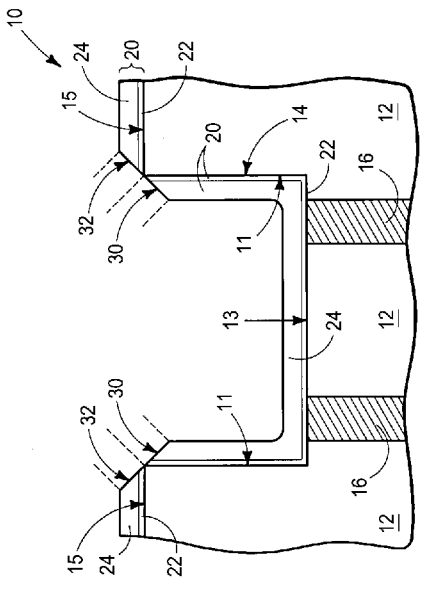
FIG. 1 is a diagrammatic structural cross-section view of a substrate in process in accordance with an embodiment of the invention.

Embodiments of the invention include methods of forming a memory cell, and memory cells independent of method of fabrication. Initial example embodiments are described with reference to FIGS. 1-4. Referring to FIG. 1, an example substrate fragment 10 in fabrication is shown. Substrate 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises dielectric material 12 that overlies other material (not shown). Dielectric material 12, and other materials referred to herein, may be homogenous or non-homogenous. Example dielectric materials 12 are doped silicon dioxide, undoped silicon dioxide, and silicon nitride.

Dielectric material 12 includes an opening 14 extending at least partially there-through. Opening 14 may be considered as comprising sidewalls 11 and a base 13, and dielectric material 12 may be considered as comprising an elevationally outermost surface 15. Surfaces 11, 13, and 15 may be curved, linear, have a combination of curved and linear segments, have a combination of linear segments that are angled relative one another, etc. Surfaces 13 and 15 may be parallel or non-parallel relative one another. Surfaces 11 may be parallel or non-parallel relative one another. One or both surfaces 11, if linear, may be perpendicular to one or both of surfaces 13 and/or 15 if at least one of them is linear.

Example substrate 10 includes two elevationally inner conductive electrodes 16 within dielectric material 12 and which extend elevationally inward from opening 14. Electrodes 16 will comprise elevationally inner conductive electrodes of two different memory cells. One inner electrode 16 or more than two inner electrodes 16 may be fabricated relative to an opening 14. Electrodes 16 may comprise any suitable electrically conductive material, for example including one or more elemental metals, alloys of two or more elemental metals, conductive metal compounds, and/or conductively doped semiconductive material. Some or all of an inner conductive electrode 16 of the memory cell being fabricated may be within an opening 14 (not shown). Regardless, elevationally inner portions of electrode 16 would connect with other portions of integrated circuitry which are not particularly material to method or structural aspects of the invention.

Programmable material 20 has been formed within dielectric material opening 14. Programmable material 20 may also be formed over dielectric material 12 laterally outside of opening 14, for example as shown. Example programmable materials include any one or more materials suitable for use in existing or yet-to-be-developed memory cells, for example in resistive RAM, magnetic RAM, ferroelectric RAM, phase change memory, programmable metallization memory cells, and conductive bridging RAM, including for example semiconductive or dielectric material having mobile dopants provided therein. The invention was primarily motivated in addressing concerns associated with highly oxidizable programmable materials, for example those comprising ion conductor solid electrolytes as disclosed in any of US Patent Publication Nos. 2011/0140065, 2011/0155988, and 2012/0037873. However, any existing or yet-to-be-developed programmable material may be used.

Example programmable material 20 is shown as comprising materials 22 and 24. In one embodiment, material 24 comprises an ion source material comprising at least one of Te, S, and Se and at least one of Cu, Ag, Zn, and Zr, for example as disclosed in one or more of the above US Patent Publications. In one embodiment, ion source material 24 may comprise a composite of two materials, for example an inner material comprising Al, Te, and N and a thicker outer material comprising Cu, Te, Zr, Ge, and Al. In one embodiment, programmable material 20 may comprise a higher-resistance material 22 in comparison to that of an ion source material 24, for example as disclosed in one or more of the above US Patent Publications. In one embodiment and as shown, programmable material 20 less-than-fills opening 14, and in one embodiment is formed as a lining within opening 14. Alternately, programmable material 20 may fill or over-fill opening 14 (not shown). Regardless, the programmable material may be deposited by any one or more suitable deposition technique(s), including physical vapor deposition, chemical vapor deposition (CVD), and atomic layer deposition (ALD), and with or without use of plasma. Example CVD and ALD precursors include di-tertbutyltelluride (for Te), tetrakis (demethylamino)zirconium (for Zr), bis(B,N'-diisopropyl-n-butyl-amidinate)Ge(II) (for Ge), tris(dimethylamino)alane dimer (for Al), bis-(diemethylamino-2-propoxy)copper(II) (for Cu), and ammonia (for N).

The programmable material within the opening is formed to have an elevationally outer edge surface which angles elevationally and laterally inward relative to a sidewall of the opening. More than one angling elevationally outer edge surface may be formed. Conductive electrode material is formed to cover over the angling surface(s) within the opening. In the context of this document, "cover", "covering", "covers", and "covered" requires a stated material to be over at least 50% of the area of a stated surface over which that material is received.

Figure 2:
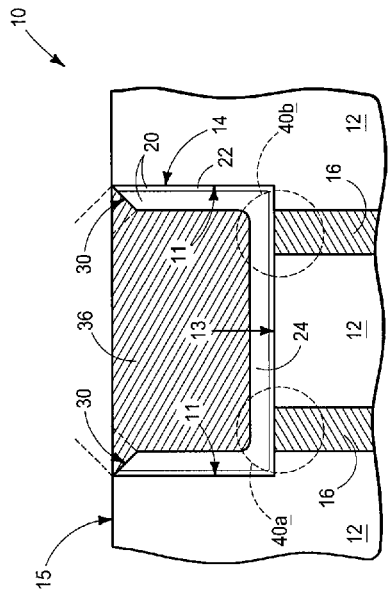
FIG. 2 is a view of the FIG. 1 substrate at a processing step subsequent to that shown by FIG. 1.

The angling surface of the programmable material may be formed before and/or during formation of the conductive electrode material within the opening. FIG. 2 shows an example where an angling elevationally outer edge surface 30 of programmable material 20 that is within opening 14 is formed before forming conductive outer electrode material (not shown in FIG. 2) within opening 14. Accordingly, an angling surface may be formed in a manner that does not deposit any layer there-over while forming the angling surface. Regardless, the angling surface may be linear or non-linear, with an example linear surface 30 being shown. FIG. 2 also shows an example where programmable material 20 that is over dielectric material 12 laterally outside of opening 14 has also been processed to have an angling surface 32 that is outside of opening 14, and which is also linear. In one embodiment and as shown, linear angling surfaces 30 and 32 are collinear.

Angling surface 30 and/or angling surface 32 may be formed by any suitable removal action, for example by etching such as facet etching, and in one embodiment without depositing any layer over the angling surface(s) while facet etching. Facet etching may be conducted, for example, by known techniques such as ion sputtering using high energy argon ions, and that may include an applied bias which tends to increase electric field at outer corners and thereby removes more material at outer corners than away from those corners. For example in ion sputter etching, ions which impinge on horizontal surfaces may have minimal effect on etch rate and profile while sputter yield in etching at step corners may be approximately four times that of the etch rate of horizontal surfaces, thereby wearing away the corners of a feature at from about 30° to 60° from horizontal. Example facet etching parameters for a reactive ion etcher include RF power of about 300 to 700 watts, pressure of about 10 to 30 mTorr, substrate temperature of about 100° C. to 300° C., and etchant (e.g., inert) flow rate of about 30 to 70 sccm.

Figure 3:
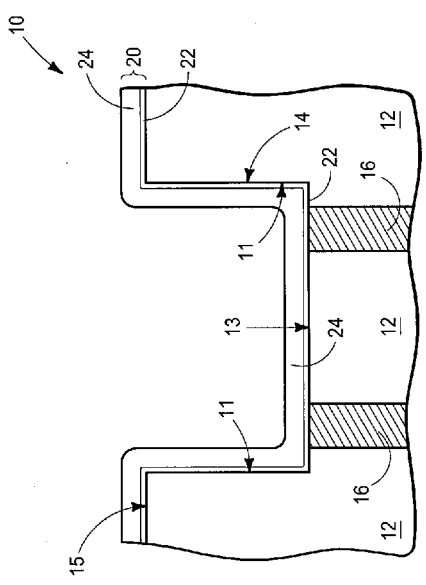
FIG. 3 is a view of the FIG. 2 substrate at a processing step subsequent to that shown by FIG. 2.

Referring to FIG. 3, conductive outer electrode material 36 has been formed over dielectric material 12 and within opening 14 to cover over angling surface 30 of programmable material 20 within opening 14. Also in one embodiment and as shown, outer electrode material 36 has been deposited over angling surface 32. Ideally, outer electrode material covers all of angling surface 30, although less-than-all of surface 30 may be covered by material 36. Where programmable material 20 is formed as a lining within opening 14, electrode material 36 is formed so that the programmable material lining within the opening is peripherally about a base and sidewalls of the conductive electrode material in at least one cross section, for example as shown. Outer electrode material 36 may be of the same or different composition as inner electrode material 16. One or both of electrode materials 16 and 36 may be electrochemically active and/or inert depending upon intended cell operation. Regardless, in one embodiment at least some of the programmable material is formed by atomic layer deposition and at least some of the outer electrode material is formed by physical vapor deposition.

In one embodiment, programmable material 20 may be oxygen-sensitive. In the context of this document, "oxygen-sensitive programmable material" defines a programmable material which would be subject to composition-changing oxidation if exposed to oxygen-containing material in the course of fabrication of the circuitry, and which may include, for example, exposure to ambient clean room air. Where the programmable material is oxygen-sensitive, ideally it is not exposed to oxygen-containing material (e.g., ambient clean room air) and outer electrode material 36 may protect the angling surface(s) from such exposure.

Figure 4:
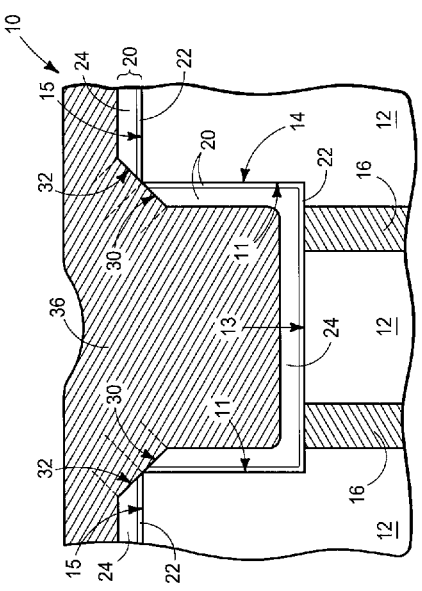
FIG. 4 is a view of the FIG. 3 substrate at a processing step subsequent to that shown by FIG. 3.

Referring to FIG. 4, conductive electrode material 36 has been removed back (i.e., elevationally inward) at least to elevationally outermost surface 15 of dielectric material 12 and to leave conductive electrode material 36 covering over angling surface 30 of programmable material 20 within opening 14. Any one or more suitable technique(s) may be used, with etching, resist etch-back, and chemical mechanical polishing being examples. Dielectric material 12 may be removed inwardly such that outermost surface 15 moves inwardly. Regardless, the amount of angling surface 30 covered by conductive material 36 may be less than was covered before the act of removing yet will be at least 50%. Ideally, all of angling surface 30 is covered before and after the act of removing.

Conductive electrode material 36 ultimately comprises an elevationally outer conductive electrode of the memory cell being formed. For example, a pair of memory cells 40a and 40b is shown in dashed outlines as respectively comprising inner electrode material 16, outer electrode material 36, and programmable material 20 there-between.

The embodiments largely described above with reference to FIGS. 1-4 show forming of angling surface 30 before forming conductive electrode material 36. Alternately as an example, the act of forming conductive material 36 within opening 14 may be conducted to inherently form angling surface 30. In other words, outer conductive electrode material 36 may be deposited in a manner that facet etches programmable material 20 during at least a portion of the deposition of conductive electrode material 36 to both form and cover angling outer edge surface 30 of programmable material 20, for example going directly from the processing depicted by FIG. 1 to that of FIG. 3. To achieve a degree of facet etching at least at the beginning of a sputter deposition, the following example conditions may be used (using a target having composition of the material being deposited): about 200 to 1000 watts RF power (400 to 600 watts being more ideal), about 100 to 300 watts DC bias, about 5 to 50 mTorr (15 to 30 mTorr being more ideal), about 3 to 100 sccm of one or more of $N_2$, Ar, He, Kr, Xe, or $O_2$, and using stationary or rotating magnets of one or more suitable shapes (e.g., triangle, oval, ellipse, bean, etc.).

Further, angling surface 30 of programmable material 20 may be formed within opening 14 by action upon programmable material 20 both before and during deposition of outer electrode material 36. For example, pre-deposition facet etching could be conducted followed by facet etching at least at a beginning portion of the deposition of the outer electrode material.

Regardless, the dielectric material at an upper portion of the opening may be formed to have a surface that angles elevationally and laterally inward relative to elevationally outermost surfaces of the dielectric material immediately adjacent the opening. The dielectric angling surface may be formed commensurate or non-commensurate with the forming of the angling surface of the programmable material, and ideally is formed commensurately therewith. Regardless, the angling surface of the dielectric material may be formed before and/or during deposition of the outer conductive electrode material. Further, if formed by some facet etching of the programmable material and the dielectric material without depositing any material over the angling surfaces, that etching may be conducted separately or in the same etching step.

Figure 5:
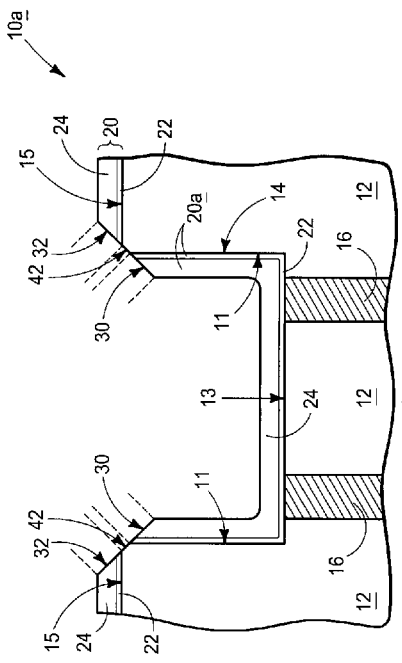
FIG. 5 is a diagrammatic structural cross-section view of a substrate in process in accordance with an embodiment of the invention.

Example embodiments of forming a dielectric angling surface are next described with reference to FIGS. 5-7 with respect to a substrate 10a. Like numerals from the above described embodiments have been used where appropriate, with some construction differences being indicated with the suffix "a". Referring to FIG. 5, the material removal action shown by FIG. 2 has been continued in FIG. 5 whereby an angling surface 42 of dielectric material 12 has been formed. Angling surface 42 angles elevationally and laterally inward relative to elevationally outermost surfaces 15 of dielectric material 12 that is immediately adjacent opening 14. Surface 42 may be curved or linear. In one embodiment where angling surface 42 of dielectric material 12 is linear and angling surface 30 of programmable material 20 is linear, angling surfaces 30 and 42 are collinear. In one embodiment where programmable material 20 is also formed over dielectric material 12 laterally outside of opening 14 and to have an angling linear surface 32 laterally outside of opening 14, angling surfaces 30, 42, and 32 are collinear.

Figure 6:
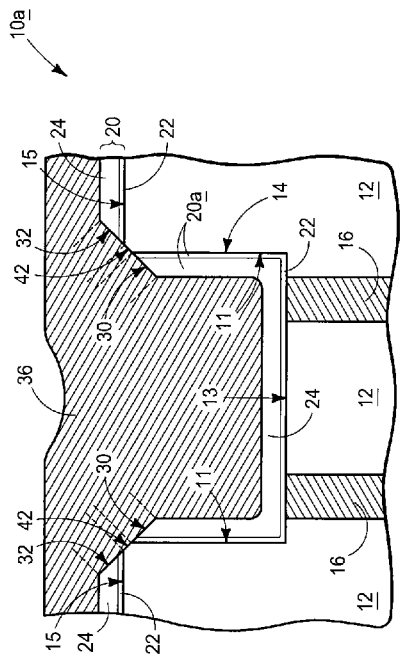
FIG. 6 is a view of the FIG. 5 substrate at a processing step subsequent to that shown by FIG. 5.
Figure 7:
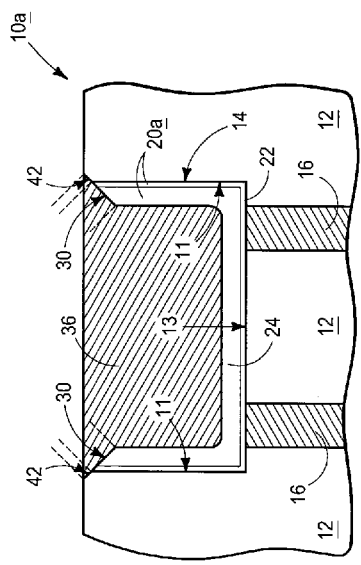
FIG. 7 is a view of the FIG. 6 substrate at a processing step subsequent to that shown by FIG. 6.

FIGS. 6 and 7 depict subsequent processing corresponding to that of FIGS. 3 and 4. As with the above described embodiments, angling surfaces 30 and 42 may be formed before and/or during formation of outer electrode material 36 within opening 14. For example, the processing may occur as shown with respect to FIGS. 5-7, or the processing shown by FIG. 6 may occur directly from that of FIG. 1 by the act of depositing outer electrode material 36.

Figure 8:
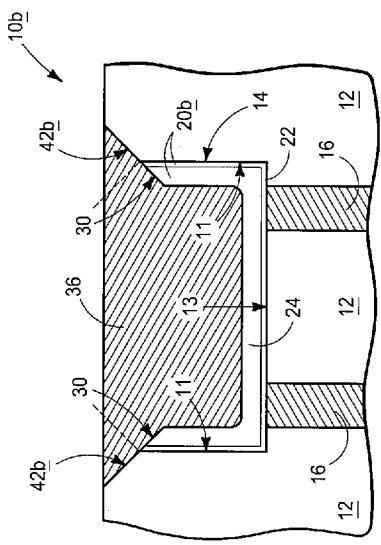
FIG. 8 is a diagrammatic structural cross-section view of a substrate in process in accordance with an embodiment of the invention.

Regardless, the angling surface of the dielectric material may be formed to be longer, shorter, or the same length as the angling surface of the programmable material within the opening. FIGS. 5-7 show an embodiment where dielectric angling surface 42 is shorter than angling surface 30 of programmable material 20 within opening 14. FIG. 8 depicts alternate processing resulting in a substrate 10b wherein dielectric angling surface 42b is longer than angling surface 30 of programmable material 20 within opening 14. Like numerals from the above described embodiments have been used where appropriate, with some construction differences being indicated with the suffix "10b".

In one embodiment where a programmable material lining is formed within the dielectric material opening, that lining may be formed to be thinner over elevationally outer portions of sidewalls of the opening than over a base of the opening. As used herein, reference to thickness or thinness of the lining is orthogonal with respect to the closest surface of the opening over which material of the lining is received. FIG. 9 shows an example embodiment substrate 10c having a programmable material lining 20c which is thinner (i.e., laterally) over elevationally outer portions of sidewalls 11 of opening 14 than over base 13 (i.e., elevationally) of opening 14. Like numerals from the above-described embodiments have been used where appropriate, with some construction differences being indicated with the suffix "c". FIG. 9 shows example processing in sequence corresponding to that shown and described above with respect to the substrate of FIG. 4. An example technique for sputter depositing material 24c to be thinner over outer portions of the sidewalls than over the base of opening 14 includes the following conditions (using a target having composition of the material being deposited): about 50 to 1,000 watts RF bias at the wafer plane (200 to 400 watts being more ideal), about 5 to 35 kilowatts at the target (10 to 30 kilowatts being more ideal), about 0.08 to 5 mTorr (0.8 to 2 mTorr being more ideal), about 1 to 100 sccm of one or more of $N_2$, Ar, He, Kr, Xe, or $O_2$, and using rotating magnets of one or more various shapes (triangle, oval, ellipse, bean, etc.).

FIGS. 10 and 11 depict alternate example constructions and processing relative to a substrate 10d and a substrate 10e, respectively. Like numerals from the above described embodiments have been used where appropriate, with some construction differences being indicated with the suffix "d" and the suffix "e", respectively. FIGS. 10 and 11 correspond in processing sequences shown and described above with respect to FIGS. 7 and 8, respectively. Any of the processing described above with respect to FIGS. 1-8 may be used in the processing to produce any of the embodiments of FIGS. 9-11.

Embodiments of the invention encompass memory cells independent of method of fabrication. In one embodiment, a memory cell comprises an elevationally inner conductive electrode. Programmable material is within an opening in dielectric material over the elevationally inner conductive electrode. The programmable material within the opening has an elevationally outer edge surface angling elevationally and laterally inward relative to sidewalls of the opening. An elevationally outer conductive electrode is within the opening covering over the angling surface of the programmable material within the opening. The outer conductive electrode may be partially within the opening, or wholly within the opening. The inner conductive electrode may be entirely external of the opening, partially within the opening, or wholly within the opening.

In one embodiment, a memory cell comprises an elevationally inner conductive electrode. A programmable material lining is within an opening in dielectric material over the elevationally inner conductive electrode. The elevationally inner conductive electrode may be entirely external of the opening, partially within the opening, or wholly within the opening. The programmable material lining within the opening has an elevationally outer edge surface that angles elevationally and laterally inward relative to sidewalls of the opening. An elevationally outer conductive electrode is within the opening. The outer conductive electrode may be partially within the opening, or wholly within the opening. The programmable material lining is peripherally about a base and sidewalls of the conductive electrode material in at least one cross section. The outer electrode covers over the angling surface of the programmable material lining within the opening.

A memory cell in accordance with the invention may have any of the attributes shown and/or described above with respect to the method embodiments.

CONCLUSION

In some embodiments, a method of forming a memory cell comprises forming programmable material within an opening in dielectric material over an elevationally inner conductive electrode of the memory cell. Conductive electrode material is formed over the dielectric material and within the opening. The programmable material within the opening has an elevationally outer edge surface angling elevationally and laterally inward relative to a sidewall of the opening. The conductive electrode material is formed to cover over the angling surface of the programmable material within the opening. The conductive electrode material is removed back at least to an elevationally outermost surface of the dielectric material and to leave the conductive electrode material covering over the angling surface of the programmable material within the opening. The conductive electrode material comprises an elevationally outer conductive electrode of the memory cell.

In some embodiments, a method of forming a memory cell comprises forming a programmable material lining in an opening in dielectric material over an elevationally inner conductive electrode of the memory cell. Conductive electrode material is deposited over the dielectric material and within the opening. The conductive electrode material is deposited in a manner that facet etches the programmable material during at least a portion of the deposition of the conductive electrode material to form and cover an angling elevationally outer edge surface of the programmable material lining within the opening. The programmable material lining is peripherally about a base and sidewalls of the conductive electrode material in at least one cross section. The conductive electrode material is removed back at least to an elevationally outermost surface of the dielectric material and to leave the conductive electrode material covering over the angling lining surface of the programmable material within the opening. The conductive electrode material comprises an elevationally outer conductive electrode of the memory cell.

In some embodiments, a method of forming a memory cell comprises forming a programmable material lining in an opening in dielectric material over an elevationally inner conductive electrode of the memory cell. The programmable material lining is facet etched to form an angling elevationally outer edge surface of the lining within the opening without depositing a layer over said angling lining surface during the facet etching. Conductive electrode material is formed over the dielectric material and within the opening to cover over the angling lining surface of the programmable material. The programmable material lining is peripherally about a base and sidewalls of the conductive electrode material in at least one cross section. The conductive electrode material is removed back at least to an elevationally outermost surface of the dielectric material and to leave the conductive electrode material covering over the angling lining surface of the programmable material within the opening. The conductive electrode material comprises an elevationally outer conductive electrode of the memory cell.

In some embodiments, a method of forming a memory cell comprises forming a programmable material lining in an opening in dielectric material over an elevationally inner conductive electrode of the memory cell. The lining is thinner over elevationally outermost portions of sidewalls of the opening than over a base of the opening. The programmable material lining is facet etched to form an angling elevationally outer edge surface of the lining within the opening. Conductive electrode material is formed over the dielectric material and within the opening to cover over the angling lining surface of the programmable material. The programmable material lining is peripherally about a base and sidewalls of the conductive electrode material in at least one cross section. The conductive electrode material is removed back at least to an elevationally outermost surface of the dielectric material and to leave the conductive electrode material covering over the angling lining surface of the programmable material within the opening. The conductive electrode material comprises an elevationally outer conductive electrode of the memory cell.

In some embodiments, a memory cell comprises an elevationally inner conductive electrode. Programmable material is within an opening in dielectric material over the elevationally inner conductive electrode. The programmable material within the opening has an elevationally outer edge surface angling elevationally and laterally inward relative to a sidewall of the opening. An elevationally outer conductive electrode is within the opening covering over the angling surface of the programmable material within the opening.

In some embodiments, a memory cell comprises an elevationally inner conductive electrode. A programmable material lining is within an opening in dielectric material over the elevationally inner conductive electrode. The programmable material lining within the opening has an elevationally outer edge surface that angles elevationally and laterally inward relative to sidewalls of the opening. An elevationally outer conductive electrode is within the opening. The programmable material lining is peripherally about a base and sidewalls of the conductive electrode material in at least one cross section. The outer electrode covers over the angling surface of the programmable material lining within the opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory cell, comprising:
    forming programmable material within an opening in dielectric material over an elevationally inner conductive electrode of the memory cell;
    forming conductive electrode material over the dielectric material and within the opening, the programmable material within the opening having an elevationally outer edge surface facing laterally inward into and away from an elevationally outermost sidewall surface of the opening and which angles elevationally and laterally inward relative to an elevationally innermost sidewall surface of the opening, the conductive electrode material being formed to cover over the angling surface of the programmable material within the opening; and
    removing the conductive electrode material elevationally inward at least to an elevationally outermost surface of the dielectric material and to leave the conductive electrode material covering over the angling surface of the programmable material within the opening, the conductive electrode material comprising an elevationally outer conductive electrode of the memory cell.

2. The method of claim 1 wherein the programmable material is formed as a lining within the opening, the conductive electrode material being formed so that the programmable material lining within the opening is peripherally about a base and sidewalls of the conductive electrode material in at least one cross section.

3. The method of claim 1 wherein the conductive electrode material is formed to cover over all of the angling outer edge surface of the programmable material within the opening, the conductive electrode material covering over all of the angling outer edge surface of the programmable material after the removing.

4. The method of claim 1 wherein,
the angling outer edge surface of the programmable material within the opening is linear;
the programmable material is formed over the dielectric material laterally outside of the opening and to have an angling linear surface laterally outside of the opening; and
the angling outer edge surface of the programmable material within the opening and the angling surface of the programmable material laterally outside of the opening being collinear.

5. The method of claim 1 wherein the angling outer edge surface of the programmable material within the opening is formed before forming the conductive electrode material within the opening without depositing a layer over said angling surface.

6. The method of claim 1 wherein the angling outer edge surface of the programmable material within the opening is formed by the act of forming the conductive electrode material within the opening.

7. The method of claim 1 wherein the angling outer edge surface of the programmable material within the opening is formed by a combination of:
before the act of forming the conductive electrode material within the opening, etching the programmable material within the opening without depositing a layer over the programmable material; and
etching the programmable material within the opening during the act of forming the conductive electrode material within the opening.

8. The method of claim 1 wherein the programmable material is oxygen-sensitive.

9. The method of claim 1 wherein the dielectric material is at an upper portion of the opening, the dielectric material at the upper portion of the opening being formed to have a surface that angles elevationally and laterally inward relative to elevationally outermost surfaces of the dielectric material immediately adjacent the opening.

10. The method of claim 9 comprising forming the angling surface of the dielectric material to be longer than the angling outer edge surface of the programmable material within the opening.

11. The method of claim 9 comprising forming the angling surface of the dielectric material to be shorter than the angling outer edge surface of the programmable material within the opening.

12. The method of claim 9 wherein,
the angling outer edge surface of the programmable material within the opening is linear;
the angling surface of the dielectric material is linear; and
the angling outer edge surface of the programmable material within the opening and the angling surface of the dielectric material being collinear.

13. The method of claim 9 wherein,
the angling outer edge surface of the programmable material within the opening is linear;
the programmable material is formed over the dielectric material laterally outside of the opening and to have an angling linear surface laterally outside of the opening;
the angling surface of the dielectric material is linear; and
the angling outer edge surface of the programmable material within the opening, the angling surface of the programmable material laterally outside of the opening, and the angling surface of the dielectric material being collinear.

14. The method of claim 9 wherein the angling outer edge surface of the programmable material within the opening and the angling surface of the dielectric material are formed before forming the conductive electrode material within the opening without depositing a layer over the angling outer edge surface of the programmable material within the opening and without depositing a layer over the angling surface of the dielectric material.

15. The method of claim 1 herein the elevationally outermost sidewall surface is linear in the dielectric material and the elevationally innermost sidewall surface is linear in the dielectric material, the elevationally outermost sidewall surface in the dielectric material and the elevationally innermost sidewall surface in the dielectric material being collinear.

16. A method of forming a memory cell, comprising:
forming programmable material within an opening in dielectric material over an elevationally inner conductive electrode of the memory cell;
forming conductive electrode material over the dielectric material and within the opening, the programmable material within the opening having an elevationally outer edge surface angling elevationally and laterally inward relative to a sidewall of the opening, the conductive electrode material being formed to cover over the angling surface of the programmable material within the opening;
removing the conductive electrode material elevationally inward at least to an elevationally outermost surface of the dielectric material and to leave the conductive electrode material covering over the angling surface of the programmable material within the opening, the conductive electrode material comprising an elevationally outer conductive electrode of the memory cell;
the dielectric material being at an upper portion of the opening, the dielectric material at the upper portion of the opening being formed to have a surface that angles elevationally and laterally inward relative to elevationally outermost surfaces of the dielectric material immediately adjacent the opening; and
the angling outer edge surface of the programmable material within the opening and the angling surface of the dielectric material being formed by the act of forming the conductive electrode material within the opening.

17. A method of forming a memory cell, comprising:
forming programmable material within an opening in dielectric material over an elevationally inner conductive electrode of the memory cell;
forming conductive electrode material over the dielectric material and within the opening, the programmable material within the opening having an elevationally outer edge surface angling elevationally and laterally inward relative to a sidewall of the opening, the conductive electrode material being formed to cover over the angling surface of the programmable material within the opening;

removing the conductive electrode material elevationally inward at least to an elevationally outermost surface of the dielectric material and to leave the conductive electrode material covering over the angling surface of the programmable material within the opening, the conductive electrode material comprising an elevationally outer conductive electrode of the memory cell;

the dielectric material being at an upper portion of the opening, the dielectric material at the upper portion of the opening being formed to have a surface that angles elevationally and laterally inward relative to elevationally outermost surfaces of the dielectric material immediately adjacent the opening; and the angling outer edge surface of the programmable material within the opening and the angling surface of the dielectric material being formed by a combination of:

before the act of forming the conductive electrode material within the opening, etching the programmable material within the opening and etching the dielectric material without depositing a layer over the programmable material and without depositing a layer over the dielectric material; and etching the programmable material within the opening and etching the dielectric material during the act of forming the conductive electrode material within the opening.

18. A method of forming a memory cell, comprising:

forming a programmable material lining in an opening in dielectric material over an elevationally inner conductive electrode of the memory cell;

depositing conductive electrode material over the dielectric material and within the opening, the conductive electrode material being deposited in a manner that facet etches the programmable material lining during at least a portion of the deposition of the conductive electrode material to form and cover an angling elevationally outer edge surface of the programmable material lining within the opening, the programmable material lining being peripherally about a base and sidewalls of the conductive electrode material in at least one cross section; and removing the conductive electrode material elevationally inward at least to an elevationally outermost surface of the dielectric material and to leave the conductive electrode material covering over the angling lining surface of the programmable material lining within the opening, the conductive electrode material comprising an elevationally outer conductive electrode of the memory cell.

19. The method of claim 18 comprising forming the programmable material lining to be thinner over elevationally outer portions of sidewalls of the opening than over a base of the opening.

20. The method of claim 18 wherein the manner in which the conductive material is deposited facet etches the dielectric material at an upper portion of the opening during at least a portion of the deposition of the conductive electrode material to form and cover a dielectric material surface that angles elevationally and laterally inward relative to elevationally outermost surfaces of the dielectric material immediately adjacent the opening.

21. The method of claim 18 wherein the conductive material covers all of the angling dielectric material surface at least prior to the removing.

22. A method of forming a memory cell, comprising:

forming a programmable material lining in an opening in dielectric material over an elevationally inner conductive electrode of the memory cell;

facet etching the programmable material lining to form an angling elevationally outer edge surface of the lining within the opening without depositing a layer over said angling lining surface during the facet etching, the facet etching forming the angling outer edge surface of the lining to face laterally inward into and away from an elevationally outer sidewall surface of the opening;

forming conductive electrode material over the dielectric material and within the opening to cover over the angling lining surface of the programmable material lining, the programmable material lining being peripherally about a base and sidewalls of the conductive electrode material in at least one cross section; and removing the conductive electrode material elevationally inward at least to an elevationally outermost surface of the dielectric material and to leave the conductive electrode material covering over the angling lining surface of the programmable material lining within the opening, the conductive electrode material comprising an elevationally outer conductive electrode of the memory cell.

23. The method of claim 22 comprising facet etching the dielectric material at an upper portion of the opening to form a dielectric material surface that angles elevationally and laterally inward relative to elevationally outermost surfaces of the dielectric material immediately adjacent the opening.

24. The method of claim 23 wherein the facet etchings of the programmable material and dielectric material are conducted in the same etching step.

25. A method of forming a memory cell, comprising:

forming a programmable material lining in an opening in dielectric material over an elevationally inner conductive electrode of the memory cell, the lining being thinner over elevationally outermost portions of sidewalls of the opening than over a base of the opening;

facet etching the programmable material lining to form an angling elevationally outer edge surface of the lining within the opening, the facet etching forming the angling outer edge surface of the lining to face laterally inward into and away from an elevationally outer sidewall surface of the opening;

forming conductive electrode material over the dielectric material and within the opening to cover over the angling lining surface of the programmable material lining, the programmable material lining being peripherally about a base and sidewalls of the conductive electrode material in at least one cross section; and removing the conductive electrode material elevationally inward at least to an elevationally outermost surface of the dielectric material and to leave the conductive electrode material covering over the angling lining surface of the programmable material lining within the opening, the conductive electrode material comprising an elevationally outer conductive electrode of the memory cell.

26. The method of claim 25 wherein the facet etching occurs before forming the conductive electrode material.

27. A method of forming a memory cell, comprising:

forming a programmable material lining in an opening in dielectric material over an elevationally inner conductive electrode of the memory cell, the lining being thinner over elevationally outermost portions of sidewalls of the opening than over a base of the opening;

facet etching the programmable material lining to form an angling elevationally outer edge surface of the lining within the opening;

forming conductive electrode material over the dielectric material and within the opening to cover over the angling lining surface of the programmable material lining, the programmable material lining being peripherally about a base and sidewalls of the conductive electrode material in at least one cross section; and removing the conductive electrode material elevationally inward at least to an elevationally outermost surface of the dielectric material and to leave the conductive electrode material covering over the angling lining surface of the programmable material lining within the opening, the conductive electrode material comprising an elevationally outer conductive electrode of the memory cell; and the facet etching occurring while forming the conductive electrode material.

28. The method of claim 27 wherein the facet etching also occurs before forming the conductive electrode material.

29. A method of forming a memory cell, comprising:

forming programmable material within an opening in dielectric material over an elevationally inner conductive electrode of the memory cell;

forming conductive electrode material over the dielectric material and within the opening, the programmable material within the opening having a linear elevationally outer edge surface facing laterally inward into and away from an elevationally outer sidewall surface of the opening and which angles elevationally and laterally inward relative to an elevationally innermost sidewall surface of the opening, the angling outer edge surface being collinear with a linear elevationally outermost sidewall surface of the opening, the conductive electrode material being formed to cover over the angling surface of the programmable material within the opening; and removing the conductive electrode material elevationally inward at least to an elevationally outermost surface of the dielectric material and to leave the conductive electrode material covering over the angling surface of the programmable material within the opening, the conductive electrode material comprising an elevationally outer conductive electrode of the memory cell.

* * * * *

UNITED STATES PATENT AND TRADEMARK OFFICE
CERTIFICATE OF CORRECTION

| | | |
|---|---|---|
| PATENT NO. | : 8,691,622 B2 | Page 1 of 1 |
| APPLICATION NO. | : 13/480610 | |
| DATED | : April 8, 2014 | |
| INVENTOR(S) | : John Smythe et al. | |

It is certified that error appears in the above-identified patent and that said Letters Patent is hereby corrected as shown below:

In the Claims

In column 11, line 61, in claim 21, delete "claim 18" and insert -- claim 20 --, therefor.

Signed and Sealed this
Seventh Day of October, 2014

Michelle K. Lee
*Deputy Director of the United States Patent and Trademark Office*